(12) United States Patent
Guhathakurta et al.

(10) Patent No.: US 12,256,640 B2
(45) Date of Patent: Mar. 18, 2025

(54) LEAD-FREE PIEZO COMPOSITES AND METHODS OF MAKING THEREOF

(71) Applicant: SABIC Global Technologies B.V., Bergen op Zoom (NL)

(72) Inventors: Soma Guhathakurta, Bangalore (IN); Jesus Alfonso Caraveo Frescas, Thuwal (SA)

(73) Assignee: SABIC Global Technologies B.V., Bergen Op Zoom (NL)

( * ) Notice: Subject to any disclaimer, the term of this patent is extended or adjusted under 35 U.S.C. 154(b) by 725 days.

(21) Appl. No.: 17/593,968

(22) PCT Filed: Mar. 31, 2020

(86) PCT No.: PCT/IB2020/053052
§ 371 (c)(1),
(2) Date: Sep. 29, 2021

(87) PCT Pub. No.: WO2020/202006
PCT Pub. Date: Oct. 8, 2020

(65) Prior Publication Data
US 2022/0181543 A1    Jun. 9, 2022

(30) Foreign Application Priority Data
Apr. 2, 2019    (IN) .............. 201911013259

(51) Int. Cl.
*H10N 30/092* (2023.01)
*C08J 3/21* (2006.01)
*C08J 5/18* (2006.01)
*C08K 3/22* (2006.01)
*H10N 30/045* (2023.01)
*H10N 30/85* (2023.01)

(52) U.S. Cl.
CPC .......... *H10N 30/092* (2023.02); *C08J 3/212* (2013.01); *C08J 5/18* (2013.01); *C08K 3/22* (2013.01); *H10N 30/045* (2023.02); *H10N 30/852* (2023.02); *C08J 2327/16* (2013.01); *C08K 2003/2237* (2013.01); *C08K 2201/001* (2013.01); *C08K 2201/005* (2013.01)

(58) Field of Classification Search
CPC .. H10N 30/092; H10N 30/852; H10N 30/045; C08J 3/212; C08J 5/18; C08J 2327/16
See application file for complete search history.

(56) References Cited

U.S. PATENT DOCUMENTS

| | | | |
|---|---|---|---|
| 5,043,622 A | 8/1991 | Sagong et al. | |
| 5,702,629 A | 12/1997 | Cui et al. | |
| 5,951,908 A | 9/1999 | Cui et al. | |
| 7,842,390 B2 | 11/2010 | Chung et al. | |
| 2010/0215836 A1 | 8/2010 | Park | |
| 2015/0134061 A1 | 5/2015 | Friis et al. | |
| 2017/0141291 A1 | 5/2017 | Aliane et al. | |
| 2017/0301466 A1 | 10/2017 | Sherman et al. | |
| 2018/0013359 A1* | 1/2018 | Park | H02N 1/08 |
| 2019/0054659 A1* | 2/2019 | Tseng | B33Y 70/10 |

FOREIGN PATENT DOCUMENTS

| | | |
|---|---|---|
| CA | 3043345 | 5/2018 |
| CN | 104157784 | * 11/2014 |
| CN | 108530806 | 9/2018 |
| CN | 111954937 | 11/2020 |
| EP | 2919249 A1 | 9/2015 |
| JP | 2016-219804 | * 12/2016 |
| JP | 2016219804 A | 12/2016 |
| KR | 20170058768 A | 11/2015 |
| WO | WO 2009116356 A1 | 9/2009 |

OTHER PUBLICATIONS

M.D. Donato, PhD thesis (2014)—Development of composite piezoelectric materials for tactile sensing.*
Vacche et al, "The effect of ptocessing consitions on the morphology, thermomechanical, dielectric, and piezoelectric properties of P(VDF-TrFE)/BaTiO3 composites", J. Mater. Sci., (2012), 47:4763-4774, Mar. 1, 2012.*
Englsih translation for JP 2016-210804, Dec. 22, 2016.*
Choi, Y. et al., "Dielectric and piezoelectric properties of ceramic-polymer composites with 0-3 connectivity type", *J Electroceram*, 30, 30-35 (2013). https://doi.org/10.1007/s10832-012-9706-7, abstract.
Dehlen, B. et al., "Influence of Solvents on the Polarization Distribution in PVDF", [Proceedings] 1992 Annual Report: Conference on Electrical Insulation and Dielectric Phenomena, 1992, pp. 172-177, doi: 10.1109/CEIDP.1992.283230.
Dong, L. et. al., "Effect of heat treatment on the electrical properties of lead zirconate titanate/poly (vinylidene fluoride) composites", *Polym. Int.*, 2010, 59: https://doi.org/10.1002/pl.2780, abstract.
International Search Report and Written Opinion for Application No. PCT/US2020/053052, mailed Jul. 14, 2020, 9 pages.
Tiwari, V. et. al., "Enhanced dielectric and piezoelectric properties of 0-3 PZT/PVDF composites", *J Polym Res*, 23, 38 (2016). https://doi.org/10.1007/s10965-016-0928-2, abstract.

(Continued)

*Primary Examiner* — C Melissa Koslow
(74) *Attorney, Agent, or Firm* — Norton Rose Fulbright US LLP

(57) ABSTRACT

Methods of producing lead-free piezoelectric composites are described. The method can include adding a lead-free piezoelectric additive to a solution that includes a solvent and polymer solubilized therein. The solvent can have i) a boiling point $\geq 80°$ C. at 0.1 MPa and ii) a solubility in water of $\geq 0.1$ g/g and/or a dielectric constant $\geq 20$. The solvent can be removed to form a polymeric matrix having the lead-free piezoelectric particles dispersed therein. Electrical treatment of the polymeric matrix can form the piezoelectric component. Lead-free piezoelectric composites and devices that include the lead-free piezoelectric composites are also described.

13 Claims, 6 Drawing Sheets

(56) References Cited

OTHER PUBLICATIONS

Vacche S.D. et. al., "The effect of processing conditions on the morphology, thermomechanical, dielectric, and piezoelectric properties of P(VDF-TrFE)/BaTiO3 composites", *J Mater Sci*, 47, (2012). https://doi.org/10.1007/s10863-012-6362-x, abstract.

X-D Chen et. al., "0-3 Piezoelectric composite film with high $d_{33}$ coefficient", *Sensors and Actuators*, 1998, A 65, abstract.

"N-methylpyrrolidone." *Stenutz*, https://www.stenutz.eu/chem/solv6.php?name=N-methylpyrrolidone. Accessed Jun. 27, 2024.

Office Action issued in corresponding European Application No. 20720862.0, dated Jul. 29, 2024.

Office Action issued in corresponding Chinese Application No. 202080026966.6 dated Aug. 19, 2024, English machine translation provided.

\* cited by examiner

FIG. 1A-D

FIG. 2A-D

LEAD-FREE PIEZO COMPOSITES AND METHODS OF MAKING THEREOF

CROSS REFERENCE TO RELATED APPLICATIONS

This application is a national phase application under 35 U.S.C. § 371 of International Application No. PCT/IB2020/053052 filed Mar. 31, 2020, which claims the benefit of priority of Indian Patent Application number 201911013259 filed Apr. 2, 2019, all of which are hereby incorporated by reference in their entirety.

BACKGROUND OF THE INVENTION

A. Field of the Invention

The invention generally concerns methods of making lead-free piezoelectric composites that include lead-free piezoelectric particles having an average particle size of 200 nm to 1000 nm dispersed or suspended in a polymeric matrix. In particular, the method includes use of a solvent having i) a boiling point ≥80° C. at 0.1 MPa and ii) a solubility in water of ≥0.10 g/g and/or a dielectric constant ≥20 to form a dispersion or suspension of the lead-free particles with polymeric material partially or fully solubilized in the solvent, forming a polymeric matrix from the suspension, and then subjecting the polymeric matrix to an electric polarization treatment.

B. Description of Related Art

Piezoelectric materials can be polymeric, ceramic, or single crystalline in nature. Ceramics can have relatively high dielectric constants as compared to polymers and good electromechanical coupling coefficients. Ceramics suffer from high acoustic impedance, which results in poor acoustic matching with media such as water and human tissue—the media through which it is typically transmitting or receiving a signal. In addition, ceramics can exhibit high stiffness and brittleness and cannot be formed onto curved surfaces, which contributes to limited design flexibility in a given transducer. Further, the electromechanical resonances of piezoelectric ceramics give rise to a high degree of noise, which is an unwanted artifact in the context of transducer engineering.

Single crystal piezoelectric material can include crystals of quartz tourmaline and potassium-sodium tartrate. Other single crystals can include lead metaniobate ($PbNb_2O_6$) or relaxor systems such as $Pb(Sc_{1/2}Nb_{1/2})O_3$—$PbTiO_3$, $Pb(In_{1/2}Nb_{1/2})O_3$—$PbTiO_3$ and $Pb(Yb_{1/2}Nb_{1/2})O_3$—$PbTiO_3$, $(1-x) BiScO_3$-$xPbTiO_3$. As with ceramics, any one single piezoelectric material phase (ceramic or crystal or polymer) does not provide all of the desired features for an application, and the performance is thereby limited by the trade-off between high piezoelectric activity and low density with mechanical flexibility.

Thin, flexible, high performing piezoelectric materials are of high demand in sensors, actuators, and energy harvesters for emerging healthcare and biomedical applications as well as for wearable electronics. However, the progress in flexible piezoelectric devices is limited due to the fact that inorganic piezoelectric ceramics are heavy and brittle. The severe processing conditions such as high temperature (>500° C.) required to obtain excellent piezoelectric performance and to process these materials as a thin layer onto the substrate, further limits the choice of the substrate materials as a high temperature resistant flexible substrate is needed. On the other hand, piezoelectric polymers, for example PVDF and PVDF-TrFE copolymer, offer several advantages, which include mechanical flexibility, light weight, low temperature and ease of processing. Despite such advantages over ceramic materials, these materials suffer due to their lower piezoelectric response ($d_{33}$~13-28 pC/N) compared to the ceramics ($d_{33}$ of PZT ranges from 270-400 pC/N) and the requirement of higher driving voltage which poses additional safety and cost concerns.

For these applications, it is desirable to achieve a balance of several conflicting requirements, which cannot be met either by piezoelectric ceramics or piezoelectric polymers. Thus, piezoelectric composites are attractive alternatives as they can combine the advantages of both the materials, high piezoelectric response, and high dielectric constant of ceramics with the mechanical flexibility of the polymers. The inherent flexibility or deformability of the piezoelectric materials is also an important parameter for the device performance, flexibility prevents fatigue and improve the lifetime of the device. Addition of piezoceramic fillers in vinylidene fluoride based polymers (homo-, co-, and terpolymers) to form (0-3) composites have shown good piezoelectric constant ($d_{33}$≈40-60 pC/N). However, these piezocomposites of the prior art are mostly lead-based and also mechanically brittle. As lead is highly toxic, environmental problems and biocompatible integration issues are inevitable.

Commercially available lead-free piezoceramics have lower piezoelectric constants than that of lead-based piezoceramic powders. Therefore, it is difficult to achieve piezoelectric performance of lead-free piezocomposites comparable to that of lead-based piezocomposites (while $d_{33}$ of PZT is ~270-400 pC/N, that of barium titanate ~190 pC/N). Thus, there is a need for lead-free piezoelectric polymer composite which offer outstanding piezoelectric properties while maintaining mechanical flexibility of the polymers. Various attempts to produce lead-free piezoceramics have been disclosed. For Example, U.S. Patent Application Publication No. 2015/0134061 to Friis et al. describes a spinal implant and a method of making the spinal implant that includes dispersing a piezoelectric ceramic in a polymer matrix. The produced composites have low $d_{33}$ (pC/N) values of less than 40. In another example, JP2016-219804 to Tetsuhiro et al. describes methods of making lead-free piezoelectric polymer materials that include the use of an affinity improver such as surfactants to aid in dispersing the particles in the polymeric matrix. Affinity improver can be difficult to remove from the desired polymer matrix and/or are costly.

Although various attempts to produce piezoelectric composites have been made, there is still a need to produce composites with a balance of desired piezoelectric performance with the mechanical flexibility.

SUMMARY OF THE INVENTION

A discovery has been found that provides a solution to some of the aforementioned problems. The discovery is premised on making a flexible piezoelectric material by using a solvent having i) a boiling point ≥80° C. at 0.1 MPa and ii) a solubility in water of ≥0.10 g/g and/or a dielectric constant ≥20 to form a dispersion or suspension of lead-free piezoelectric particles with a polymer partially or fully solubilized in the solvent. Removal of the solvent forms a polymeric material having the lead-free piezoelectric particles dispersed therein. The polymeric material can be subjected to electric polarization treatment to form the piezoelectric polymeric material of the present invention. Using the higher boiling solvents during processing provides the advantages of 1) ability to form a flexible piezoelectric material having excellent piezoelectric property with mechanical flexibility, 2) thin film forming ability, both free-standing and supported film on the substrate, 3) simple process of making the piezocomposites, and/or 4) low temperature processability.

In one aspect of the invention, methods to produce lead-free piezoelectric composites are described. A method can include a first step (a) of adding lead-free piezoelectric particles having an average particle size of 200 nm to 1000 nm in a solution that includes a polymeric material and a solvent having i) a boiling point ≥80° C. at 0.1 MPa and ii) a solubility in water of ≥0.10 g/g, preferably 0.15 g/g, more preferably 0.25 g/g and/or a dielectric constant of ≥20, preferably ≥30, more preferably ≥55, to form a dispersion or suspension. The polymeric material can be partially or fully solubilized in the solvent and can include a thermoset polymer, thermoplastic polymer, or blends thereof, preferably a thermoplastic polymer. Non-limiting examples of a thermoplastic polymer include polyvinylidene fluoride (PVDF), a PVDF-based polymer, a PVDF copolymer, a PVDF terpolymer, or blends thereof. A PVDF terpolymer can be poly(vinylidene fluoridetrifluoroethylene-chlorofluoroethylene) (PVDF-TrFE-CFE). In some aspects, the PVDF type polymers can exhibit electromechanical or ferroelectric properties. The polymeric material can be solubilized in the solvent at a temperature of 15 to 100° C. to produce a solution that include 5 to 20 wt./vol. % of polymer, preferably 10 wt./vol. % to 12 wt./vol. % of polymer. Non-limiting examples of the lead-free piezoelectric particles include barium titanate, particles of hydroxyapatite, particles of apatite, particles of lithium sulfate monohydrate, particles of sodium potassium niobate, particles of quartz, and combinations thereof. In a preferred embodiment, the lead-free piezoelectric particles are barium titanate particles. Non-limiting examples of solvent include methyl ethyl ketone (MEK), dimethylsulfoxide (DMSO), N-methyl-2-pyrrolidone (NMP), or combinations thereof, preferably DMSO. In some instances, a volume percentage of lead-free piezoelectric particles in the composite can be from 15 to 65 vol. %, preferably 20 to 60 vol. %. The lead-free piezoelectric particles can have a particle size of 250 to 350 nm, preferably 300 nm. A second step (b) can include forming a polymeric matrix having the lead-free piezoelectric particles dispersed therein. Forming can include (i) casting the dispersion on a substrate to form the polymeric matrix, (ii) drying the polymeric matrix at 25 to 45° C., and (iii) annealing the dried polymeric matrix at a temperature of 80 to 150° C. for 1 to 50 hours, preferably 110° C. for 5 to 25 hours. A third step (c) can include subjecting the polymeric matrix having the lead-free piezoelectric particles dispersed therein to an electric polarization treatment. Electric polarization can include applying a poling field using corona discharge. For a piezocomposite film, corona poling can be subjected to a top surface (which was exposed to air during drying of the film) and/or a bottom surface (which was in contact with substrate during drying of the film) of the film.

In another aspect of the invention, lead-free piezoelectric composites and lead-free piezoelectric composite precursors are described. A lead-free piezoelectric composite precursor can include a polyvinylidene fluoride (PVDF) based polymer matrix, lead-free piezoelectric particles having an average particle size of 200 to 1000 nm dispersed in the polymeric matrix, and a solvent having i) a boiling point ≥80° C. at 0.1 MPa and ii) a solubility in water of ≥0.1 g/g and/or a dielectric constant of ≥20. A lead-free piezoelectric composite can include a polyvinylidene fluoride (PVDF) based polymer matrix and lead-free piezoelectric particles having an average particle size of 200 to 1000 nm dispersed in the polymeric matrix. The piezoelectric composite can have a piezoelectric strain constant ($d_{33}$) of at least 40 pC/N and an elongation break of 100 to 500%, and a storage modulus of 100 to 325 MPa as measured using ISO Method 6721. The piezoelectric composite can have a piezoelectric strain constant ($d_{33}$) of at least 40 pC/N and an elongation break of 100 to 500%, and a storage modulus of 100 to 325 MPa as measured using ISO Method 6721. Elongation break can be measured using a dynamic mechanical analyzer such as a RDA III analyser (TA Instruments, U.S.A.) under uniaxial loading at ambient temperature. The PVDF terpolymer can be a poly(vinylidene fluoride-trifluoroethylene-chlorofluoroethylene) (PVDF-TrFE-CFE). The lead-free piezoelectric particles can be barium titanate particles having an average particle size of 250 to 350 nm. The composite can be a film or sheet and can have a dimension of 50 to 200 microns in thickness. Such a piezoelectric polymeric composite can be formed in the absence of compatibility improvers and/or is made by the method of the present invention. In some embodiments, the lead-free piezoelectric polymeric composite can include, consists of, or consists essentially of poly(vinylidene fluoride-trifluoroethylene-chlorofluoroethylene) (PVDF-TrFE-CFE) and barium titanate particles having an average particle size of 250 to 350 nm.

In another aspect of the present invention, piezoelectric devices that include the lead-free piezoelectric polymeric composites of the present invention are described. Such devices can be a piezoelectric sensor, a piezoelectric transducer, or a piezoelectric actuator. The device is preferably mechanically flexible.

Other embodiments of the invention are discussed throughout this application. Any embodiment discussed with respect to one aspect of the invention applies to other aspects of the invention as well and vice versa. Each embodiment described herein is understood to be embodiments of the invention that are applicable to other aspects of the invention. It is contemplated that any embodiment discussed herein can be implemented with respect to any method or composition of the invention, and vice versa. Furthermore, compositions and kits of the invention can be used to achieve methods of the invention.

The following includes definitions of various terms and phrases used throughout this specification.

The phrase "compatibility improvers" refers to a compound that improves the dispersability or incorporation of a solid into a polymer. Non-limiting examples of compatibility improvers include surfactants such as non-ionic surfactants, cationic surfactants, and anionic surfactants.

The terms "about" or "approximately" are defined as being close to as understood by one of ordinary skill in the art. In one non-limiting embodiment, the terms are defined to be within 10%, preferably within 5%, more preferably within 1%, and most preferably within 0.5%.

The terms "wt. %," "vol. %," or "mol. %" refers to a weight percentage of a component, a volume percentage of a component, or molar percentage of a component, respectively, based on the total weight, the total volume of material, or total moles, that includes the component. In a non-limiting example, 10 grams of component in 100 grams of the material is 10 wt. % of component.

The term "substantially" and its variations are defined to include ranges within 10%, within 5%, within 1%, or within 0.5%.

The terms "inhibiting" or "reducing" or "preventing" or "avoiding" or any variation of these terms, when used in the claims and/or the specification includes any measurable decrease or complete inhibition to achieve a desired result.

The term "effective," as that term is used in the specification and/or claims, means adequate to accomplish a desired, expected, or intended result.

The use of the words "a" or "an" when used in conjunction with any of the terms "comprising," "including," "containing," or "having" in the claims, or the specification, may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The piezoelectric composites of the present invention can "comprise," "consist essentially of," or "consist of" particular ingredients, components, compositions, etc. disclosed throughout the specification. With respect to the transitional phrase "consisting essentially of," in one non-limiting aspect, a basic and novel characteristic of the piezoelectric composites of the present invention is that they can be lead-free, mechanically flexible, and/or have piezoelectric strain constant ($d_{33}$) of at least 40 pC/N.

Other objects, features, and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description. In further embodiments, features from specific embodiments may be combined with features from other embodiments. For example, features from one embodiment may be combined with features from any of the other embodiments. In further embodiments, additional features may be added to the specific embodiments described herein.

BRIEF DESCRIPTION OF THE DRAWINGS

Advantages of the present invention may become apparent to those skilled in the art with the benefit of the following detailed description and upon reference to the accompanying drawings.

Figure 1:
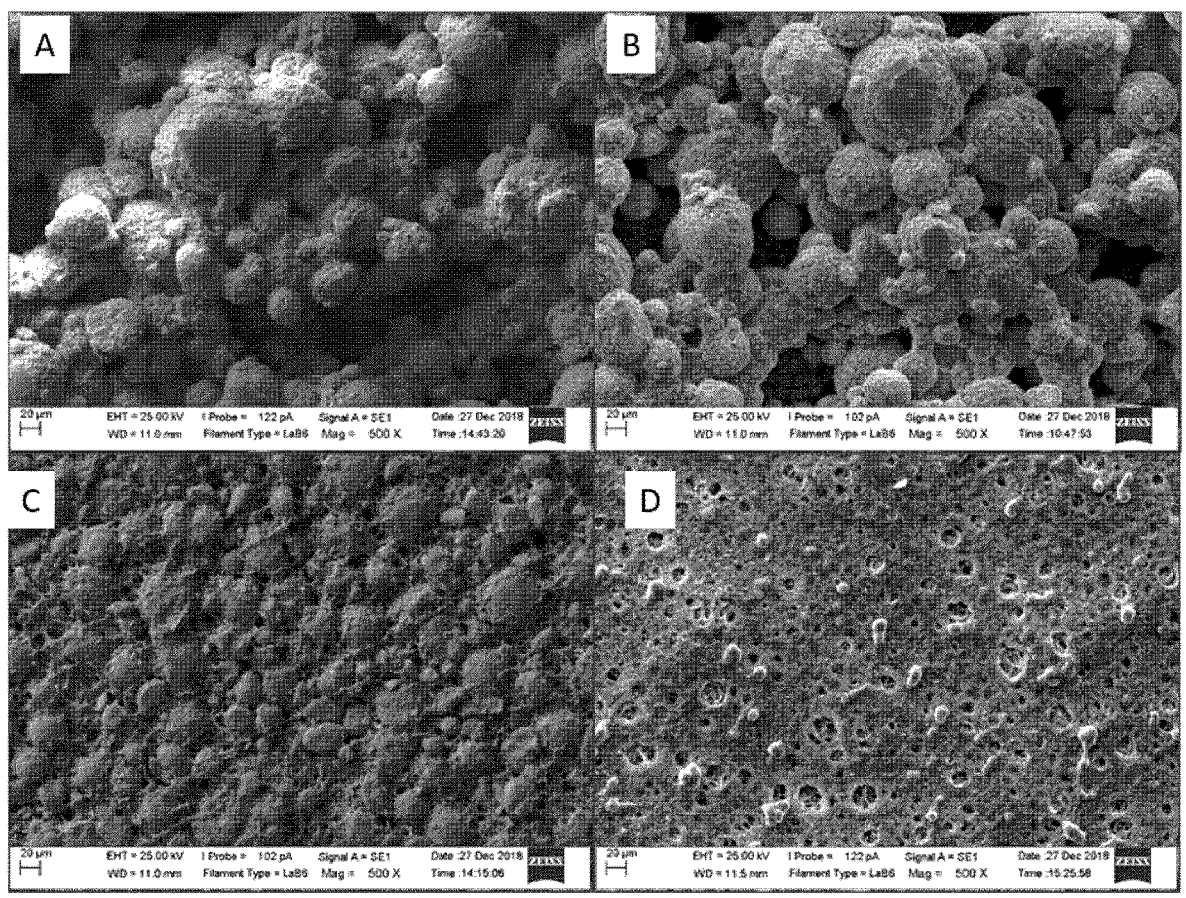
FIGS. 1A-D show scanning electron micrographs of top surface of piezoelectric polymer composite made using different solvents: a) MEK, b) THF, c) DMSO, d) NMP.

While the invention is susceptible to various modifications and alternative forms, specific embodiments thereof are shown by way of example in the drawings. The drawings may not be to scale.

DETAILED DESCRIPTION OF THE INVENTION

A discovery has been made that improves the mechanical and electrical properties of lead-free piezoelectric compositions. The discovery is premised on using a solvent during the preparation of the polymeric matrix. The solvent can have i) a boiling point ≥80° C. at 0.1 MPa and ii) a solubility in water of ≥0.10 g/g and/or a dielectric constant ≥20, which allows for partial or complete solubilization of the polymer. Solubilization of the polymer allows for better dispersion and/or suspension of the lead-free piezoelectric particles in the formed polymeric matrix upon removal of the solvent.

These and other non-limiting aspects of the present invention are discussed in further detail in the following sections.

A. Materials

1. Piezoelectric Additives

The piezoelectric additive can be any lead-free ceramic or single crystal material. Non-limiting examples of piezoelectric materials include inorganic compounds of the perovskite family. Non-limiting examples of piezoelectric ceramics with the perovskite structure include barium titanate ($BaTiO_3$), hydroxyapatite, apatite, lithium sulfate monohydrate, sodium potassium niobate, sodium bismuth titanate, quartz, organic materials (for example, tartaric acid, poly(vinylidene difluoride) fibers), or combinations thereof. In a preferred embodiment, the piezoelectric additive is $BaTiO_3$. The lead-free piezoelectric particles can have a particle size of 200 nm to 1000 nm, or 250 nm to 350 nm, or at least, greater than any one of, equal to any one of, or between any two of 200 nm, 225 nm, 250 nm, 275 nm, 300 nm, 325 nm, 350 nm, 375 nm, 400 nm, 425 nm, 450 nm, 475 nm, 500 nm, 525 nm, 550 nm, 575 nm, 600 nm, 625 nm, 650 nm, 675 nm, 700 nm, 725 nm, 750 nm, 775 nm, 800 nm, 825 nm, 850 nm, 875 nm, 900 nm, 925 nm, 950 nm, 975 nm, and 1000 nm.

2. Polymers

The piezoelectric composite can include a thermoset polymer, copolymer and/or monomer, a thermoplastic polymer, copolymer and/or monomer or a thermoset/thermoplastic polymer or copolymer blend.

Thermoset polymers are malleable prior to heating and capable of forming a mold. The matrix can be made from a composition having a thermoplastic polymer and can also include other non-thermoplastic polymers, additives, and the like, that can be added to the composition. Thermoset polymeric matrices are cured or become cross-linked and tend to lose the ability to become pliable or moldable at raised temperatures. Non-limiting examples of thermoset polymers used to make the polymer film include epoxy resins, epoxy vinylesters, alkyds, amino-based polymers (e.g., polyurethanes, urea-formaldehyde), diallyl phthalate, phenolics polymers, polyesters, unsaturated polyester resins, dicyclopentadiene, polyimides, silicon polymers, cyanate esters of polycyanurates, thermosetting polyacrylic resins, bakelite, Duroplast, benzoxazines, or co-polymers thereof, or blends thereof.

Thermoplastic polymeric matrices have the ability to become pliable or moldable above a specific temperature and solidify below the temperature. The polymeric matrix of the composites can include thermoplastic or thermoset polymers, co-polymers thereof, and blends thereof that are discussed throughout the present application. Non-limiting examples of thermoplastic polymers include polyvinylidene fluoride (PVDF), PVDF-based polymer, PVDF copolymer, PVDF terpolymer, odd-numbered nylon, cyano-polymer, polyethylene terephthalate (PET), a polycarbonate (PC) family of polymers, polybutylene terephthalate (PBT), poly(1,4-cyclohexylidene cyclohexane-1,4-dicarboxylate) (PCCD), glycol modified polycyclohexyl terephthalate (PCTG), poly(phenylene oxide) (PPO), polypropylene (PP), polyethylene (PE), polyvinyl chloride (PVC), polystyrene (PS), polymethyl methacrylate (PMMA), polyethyleneimine or polyetherimide (PEI) and their derivatives, thermoplastic elastomer (TPE), terephthalic acid (TPA) elastomers, poly(cyclohexanedimethylene terephthalate) (PCT), polyethylene naphthalate (PEN), polyamide (PA), polysulfone sulfonate (PSS), sulfonates of polysulfones, polyether ether ketone (PEEK), polyether ketone ketone (PEKK), acrylonitrile butylidene styrene (ABS), polyphenylene sulfide (PPS), copolymers thereof, or blends thereof. In addition to these, other thermoplastic polymers known to those of skill in the art, and those hereinafter developed, can also be used in the context of the present invention. The thermoplastic polymer can be included in a composition that includes said polymer and additives. Non-limiting examples of additives include coupling agents, antioxidants, heat stabilizers, flow modifiers, colorants, etc., or any combinations thereof. In a preferred instance, a polyvinylidene difluoride (PVDF) polymer, a copolymer thereof, or a terpolymer thereof is used. The terpolymer can be poly(vinylidene fluoride-trifluoroethylene-chlorofluoroethylene) (PVDF-TrFE-CFE).

3. Solvents

The solvents used in the production of the lead-free piezoelectric composite can be any solvent having i) a boiling point ≥80° C. at 0.1 MPa and ii) a solubility in water of ≥0.1 g/g and/or a dielectric constant ≥20. Non-limiting examples of solvents include methyl ethyl ketone (MEK), dimethylsulfoxide (DMSO), N-methyl-2-pyrrolidone (NMP), or combinations thereof. In a preferred embodiment, the solvent is DMSO. The solubility of the solvent in water can be at least, equal to, or greater than 0.1 g/g, 0.15 g/g, 0.20 g/g, 0.25 g/g, 0.3 g/g, 0.35 g/g, 0.4 g/g, 0.45 g/g, 0.5 g/g, 0.55 g/g, 0.6 g/g, 0.65 g/g, 0.7 g/g, 0.8 g/g, or 0.9 g/g. The boiling point of the solvent at 0.1 MPa can be at least, equal to, or greater than 80° C., 85° C., 90° C., 95° C., 100° C., 105° C., 110° C., 115° C., 120° C., 125° C., 130° C., 135° C., 140° C., 145° C., 150° C., 155° C., 160° C., 165° C., 170° C., 180° C., 185° C., 190° C., 195° C., 200° C., and 210° C. Various combinations of i) boiling point and ii) solubility and/or dielectric constant can be used as long as the criteria are met. For example, a solvent can have a boiling point of 80 and be highly soluble in water (>0.5 g/g). In another example, the solvent can have a boiling point of >150° C. and be moderately soluble in water (>0.1 g/g). In some embodiments, the solvent has a boiling point ≥80° C. at 0.1 MPa and a solubility in water of ≥0.25 g/g, boiling point ≥180° C. at 0.1 MPa and a solubility in water of ≥0.25 g/g, or boiling point ≥200° C. at 0.1 MPa and a solubility in water of ≥0.25 g/g. In another example, the solvent can have a boiling point of 80 and a high dielectric constant (>50). In another example, the solvent can have a boiling point of >150° C. and a moderate dielectric constant (>20). In some embodiments, the solvent has a boiling point ≥80° C. at 0.1 MPa and a dielectric constant ≥50, boiling point ≥180° C. at 0.1 MPa and a dielectric constant ≥50, or boiling point ≥200° C. at 0.1 MPa and a dielectric constant ≥50. Solvents that do not meet the boiling point and solubility, and/or boiling point and dielectric constant criteria may produce piezoelectric composites with inferior $d_{33}$ (pC/N) values. Table 1 lists the properties of non-limiting solvents used in the present invention.

TABLE 1

| Property | MEK | DMSO | NMP |
| --- | --- | --- | --- |
| Boiling Point (° C.) | 80 | 189 | 202 |
| Sol. In water g/100 g | 25.6 | 25.3 | 10 |
| Dielectric Constant | 18.5 | 47 | 32 |

B. Method of Producing Piezoelectric Composites

The piezoelectric composite can be made using solution casting or forming methodology. A solution of a polymer described in the Materials section can be obtained. The solution can include a solvent described in the Materials section and polymer described in the Materials section. The solution can include at least, greater than any one of, equal to any one of, or between any two of 1.5 wt./vol. %, 5 wt./vol. %, 10 wt./vol. %, 15 wt./vol. %, and 20 wt./vol. % of the polymer. In some embodiments, the solution includes and 10 wt. % to 12 wt. % PVDF or PVDF-TrFE-CFE or a blend thereof Notably, no compatibility improvers are used to make the lead-free polymeric composites of the present invention.

The piezoelectric additive can be dispersed or suspended in the polymer solution. The piezoelectric additive can be a plurality (e.g., 2 or more, suitably 5 or more, 10 or more, 50 or more, 100 or more, 500 or more, 1000 or more, etc.) of lead-free piezoelectric particles. The lead-free piezoelectric particles can be dispersed in the solution via any suitable method, including mixing, stirring, folding or otherwise integrating the lead-free piezoelectric particles in the matrix so as to generate a uniform dispersion or suspension of the particles in the matrix. In some embodiments, the solution is added to the piezoelectric additive.

The dispersion or suspension can be subjected to conditions suitable to form the piezoelectric composite of the present invention. The following description references dispersion, but it also applies to a suspension. In one instance, the dispersion includes PVDF, PVDF-TrFE, or PVDF-TrFE-CFE or a blend thereof, and barium titanate. In some embodiments, the dispersion can be shaped or cast. Shaped or shaping, or casting can include a mechanical or physical processes to change to a desired form. Shaping can also include simply placing a dispersion into a desired container or receptacle, thereby providing it with a maintained shape or form. It should be noted that the shaped form is not necessarily the final form, as additional processing (e.g., machining, forming, etc.) can be completed on the final, cured composite. The act of shaping the dispersion for use in the methods described herein is primarily to give some initial structure to the dispersion prior to further processing. A rigid or specific shape is not required.

Casting can be pouring the dispersion on a casting surface. Non-limiting examples of casting include air casting (e.g., the dispersion passes under a series of air flow ducts that control the evaporation of the solvents in a particular set period of time such as 24 to 48 hours), solvent or emersion casting, (e.g., the dispersion is spread onto a moving belt and run through a bath or liquid in which the liquid within the bath exchanges with the solvent). The spreading of the dispersion on the casting surface can be done with a doctor blade, rolling spreader bar or any of several configurations of flat sheeting extrusion dies.

During casting or shaping, the solvent can be removed thereby leaving the dispersion on the substrate or in the mold. Heat can be applied to assist in the removal of the solvent. By way of example, the shaped material can be heated at a temperature of at least, greater than any one of, equal to any one of, or between any two of 50° C., 55° C., 60° C., 65° C., 70° C., 75° C., and 80° C. The resulting shaped polymeric composite material can be annealed at a temperature of at least, greater than any one of, equal to any one of, or between any two of 80° C., 85° C., 90° C., 95° C., 100° C., 105° C., 110° C., 115° C., and 120° C. for a desired amount of time (e.g., 5, 10, 15, 20, 25 hours or any range or value there between). The shaped material can be a film, a sheet or the like. Some or all of the solvent can be removed during the heating process. For example, heating and/or annealing the lead-free piezoelectric polymeric precursor composite material can remove at least, greater than any one of, equal to any one of, or between any two of 50, 55, 60, 65, 70, 75, 80, 85, 90, 95, and 100 wt. % of the solvent.

After annealing the shaped polymeric composite material can be subjected to conditions to induce electric polarization in the lead-free piezoelectric additive (e.g., plurality of particles) in the polymeric composite material. During electric polarization, the piezoelectric particles can be connected to one another in a linear or semi-linear manner (e.g., chains of particles). Columns of piezoelectric particles are suitably formed by the stacking or aligning of more than one chain. In a non-limiting example, the shaped polymeric composite material can be poled. By way of example, the polymeric composite material can be poled with a selected electric field at room temperature (e.g., after cooling of the composite), or at a selected electric field at a selected temperature, at least one of the selected electric field and the selected temperature being chosen in accordance with a desired dipole orientation, a desired polarization strength, or property of the article of manufacture.

The temperature for performing poling can be in accordance with a desired dipole orientation and/or a desired polarization strength, or in accordance with a desired stress state of a finished actuator. For example, the poling can be performed at a selected cooling temperature range, through a selected heating temperature, or through a selected heating temperature heating and cooling temperature range. In some instance, the poling may occur over a "range" (e.g., selected range) of temperatures rather than at a specific constant temperature. In some embodiments, poling can be performed at a temperature of at least, greater than any one of, equal to any one of, or between any two of 80° C., 85° C., 90° C., 95° C., 100° C., 105° C., 110° C., 115° C., and 120° C. The applied voltage level parameter for the poling can be selected in various ways. For example, the applied voltage level parameter can be selected as constant, or changing (e.g., ramped) over a period of time. In some embodiments, poling is performed using corona discharge using an electrode gap of 0.5 to 1.5 cm, or about 1 cm for a desired amount of time (e.g., about 1 hour).

C. Piezoelectric Composite

The piezoelectric composite can include a polymer and a lead-free piezoelectric additive. The piezoelectric composite can include at least, greater than any one of, equal to any one of, or between any two of 1, 10, 20, 30, 40, 45, 50, 55, 60, 65, 70, 75, 80, 85, 90, 95, and 99 wt. % polymer matrix. The amount of lead-free piezoelectric additive present in the polymer matrix can be at least, greater than any one of, equal to any one of, or between any two of 15, 20, 25, 30, 35, 40, 45, 50, 55, 60, and 65 vol. %. In some embodiments, the piezoelectric composite includes PVDF-TrFE-CFE and 20 vol. % to 60 vol. % barium titanate particles having an average particle size of 250 to 350 nm. In some embodiments, the piezoelectric composite includes, consists of, or consists essentially of PVDF-TrFE-CFE and 20 vol. % to 60 vol. % barium titanate particles having an average particle size of 250 to 350 nm. In some embodiments, the piezoelectric composite can have less than 0.1 wt. % of solvent or between 0 and 0.1 wt. % solvent.

In some embodiments, the piezoelectric composite can have any shape or form. In some embodiments, the piezoelectric composite is a film or sheet. In some embodiments, the film or sheet has a thickness dimension of 50 to 200 microns, or at least, greater than any one of, equal to any one of, or between any two of 50, 60, 70, 80, 90, 100, 110, 120, 130, 140, 150, 160, 170, 180, 190, and 200 microns.

Properties of the piezoelectric composite include electrical and mechanical properties. Non-limiting examples of electrical properties can include piezoelectric constant, dielectric constant, and the like. The $d_{33}$ of the piezoelectric composite be at least, equal to, or between 40 pC/N, 45 pC/N, 50 pC/N, 55 pC/N, 56 pC/N, 57 pC/N, 58 pC/N, 59 pC/N, 60 pC/N, 61 pC/N, 62 pC/N, 63 pC/N, 64 pC/N, 65 pC/N, 66 pC/N, 67 pC/N, 68 pC/N, 69 pC/N, and 70 pC/N. By way of example, the piezoelectric composite can have a dielectric constant that is less than any one of, equal to any one of, or between any two of 120, 115, 110, 105, 100, 95, 90, 85, 80, 75, 70, 65, 60, 55, 50, 45, 40, and 35. In some embodiments, the dielectric constant is from 90 to 210. The lead-free piezoelectric composite can have a storage modulus can range from 100 to 325 MPa, or at least, greater than any one of, equal to any one of, or between any two of 100, 125, 150, 175, 200, 225, 250, 275, 300, and 325 MPa. Storage modulus can be measured according to ISO 6721 at room temperature and a 1 Hz strain of 0.2%. The lead-free piezoelectric composite can have an elongation break of 30 to 500% under uniaxial loading at room temperature (e.g., 25 to 35° C.). Elongation break can be measured using standard dynamic mechanical analyzer such as a RDA III analyser (TA Instruments, U.S.A.).

D. Devices

The piezoelectric device can be included in a device. In a preferred instance, the device is flexible. In some particular, instances, the piezoelectric material of the present invention can be used in articles of manufacture that have curved surfaces, flexible surfaces, deformable surfaces, etc. Non-limiting examples of such articles of manufacture include a piezoelectric sensor, a piezoelectric transducer, a piezoelectric actuator. These components can be used in tactile sensitive devices, electronic devices (e.g., smart phones, tablets, computers, etc.), virtual reality devices, augmented reality devices, fixtures that require flexibility such as adjustable mounted wireless headsets and/or ear buds, communication helmets with curvatures, medical batches, flexible identification cards, flexible sporting goods, packaging materials, medical devices, and/or applications where the presence of a bendable material simplifies final product design, engineering, and/or mass production.

EXAMPLES

The present invention will be described in greater detail by way of specific examples. The following examples are offered for illustrative purposes only, and are not intended to limit the invention in any manner. Those of skill in the art will readily recognize a variety of noncritical parameters which can be changed or modified to yield essentially the same results.

Examples 1-8

(Preparation of Lead-Free Piezoelectric Polymeric Composites)

PVDF-TrFE-CFE resin powder (about 2 g) was dissolved in the solvent (16 mL) taken in round bottom flask fitted with a condenser. The desired amount of barium titanate (BT) was then added slowly under stirring at 200 to 250 rpm using a magnetic stirrer. After stirring for 30 min, the mixture was casted into a thin film using doctor blade on to a substrate, followed by drying in open air. The drying time was adjusted depending on the solvent used for making the composites. After drying, the films were peeled off from the glass plate and annealed under nitrogen. The compositions of the piezocomposites prepared following the procedure mentioned above and the solvent used for making the composites are provided in Table 2.

Comparative Examples 1-4

(Preparation of Lead-Based Piezoelectric Polymeric Composites)

Following the procedure described above for Example 1-8, lead-based piezocomposites were prepared using PZT in place of BT. The composition and solvent used for making the piezocomposites are provided in Table 2.

TABLE 2

Piezocomposite compositions using PVDF-TrFE-CFE as polymer matrix

| Example no. | Solvent used for solution casting | Type of filler | Particle size of filler (nm) | Filler loading (vol. %) |
| --- | --- | --- | --- | --- |
| 1 | MEK | BT | 300 | 20 |
| 2 | MEK | BT | 300 | 40 |
| 3 | MEK | BT | 300 | 60 |
| 4 | THF | BT | 300 | 60 |
| 5 | DMSO | BT | 300 | 60 |
| 6 | NMP | BT | 300 | 60 |
| 7 | THF | BT | 700 | 60 |
| 8 | THF | BT | <2000 | 60 |
| Comparative Ex 1 | MEK | PZT | 2000-4000 | 20 |
| Comparative Ex 2 | MEK | PZT | 2000-4000 | 40 |
| Comparative Ex 3 | MEK | PZT | 2000-4000 | 60 |
| Comparative Ex 4 | THF | PZT | 2000-4000 | 60 |

Example 9

(Piezoelectric Response of Piezoelectric Polymeric Composites)

The piezocomposite films (dimension 3 cm×3 cm) from Table 2 were subjected to corona poling for the demonstration of piezoelectric response. Corona poling (of top surface which was exposed to air during drying of the film and/or bottom surface which was in contact with substrate during drying of the film) of the piezocomposites was carried out under the conditions detailed below. The needles were kept at high voltage (typically 10 KV). Poling temperature was 110° C. for BT based composites (Examples 1-8) and 115° C. for PZT based composites (Comparative Examples 1-4). The electrode gap was 1 cm, and poling time was 1 h. The samples were cooled to room temperature under the same applied voltage. The poled films were kept for 48 h and then the piezoelectric strain constant ($d_{33}$) of the poled films was measured at ambient temperature using Berlin court type d33 meter, (PM300, Piezo Test, UK) at the frequency of 110 Hz, clamping force of 10 N and oscillatory force 0.25 N.

Example 10

(Mechanical Properties of Piezoelectric Polymer Composites)

The storage modulus (or elastic modulus) of each of the piezoelectric polymer composites was obtained by dynamic mechanical analysis performed on RDA III as a function of time. The tensile test under uniaxial loading was performed at ambient temperature.

Figure 2:
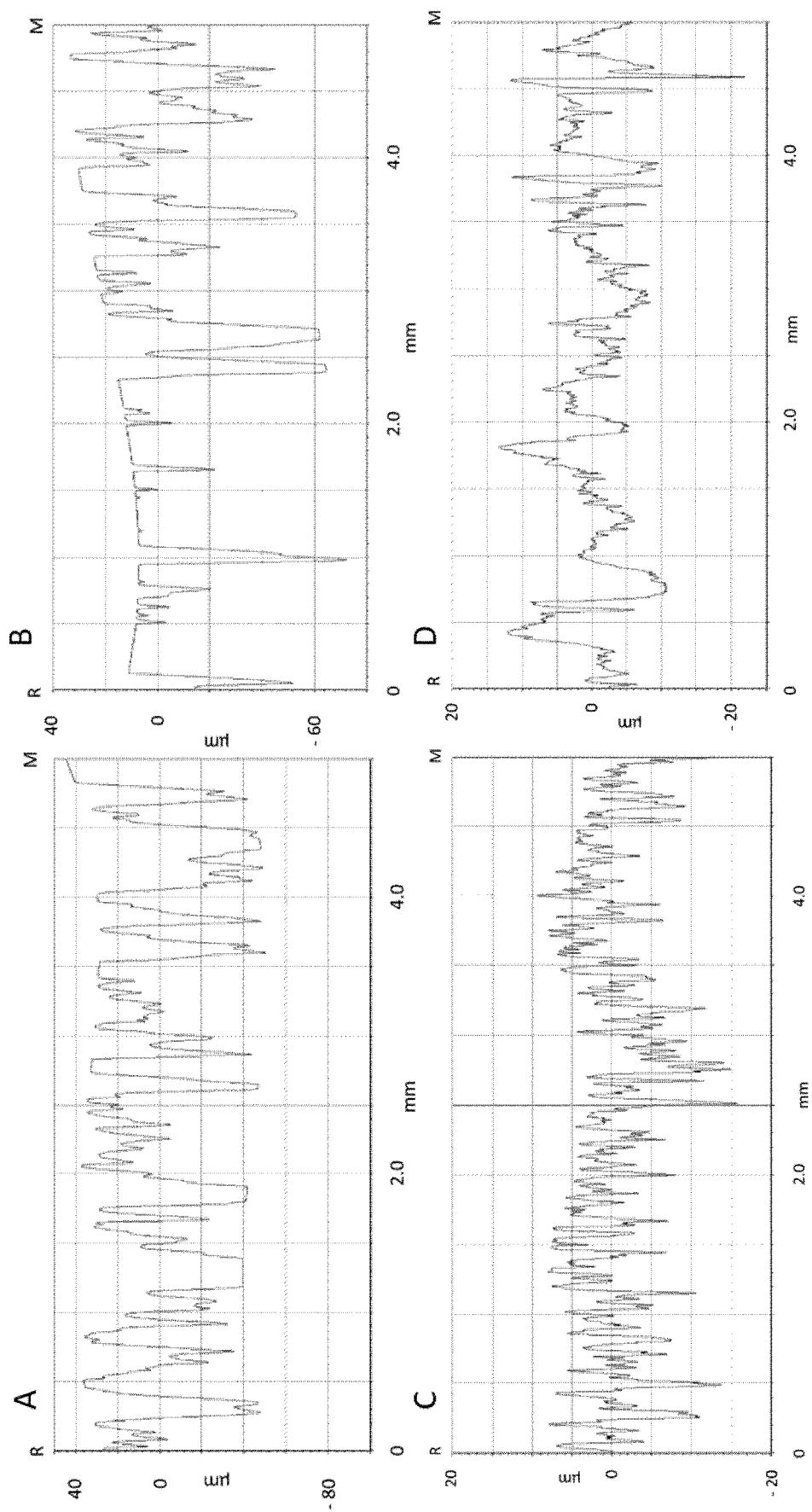
FIGS. 2A-D show surface profilometer plots within the sampling length (5 mm) for top surface of piezoelectric polymer composite made using different solvents: a) MEK, b) THF, c) DMSO, d) NMP.

Four different types of solvents were used for the preparation of piezo piezoelectric polymer composites as indicated in Table 2. Table 3 lists the relevant physical properties of the solvent. The Fourier Transform Infra-red (FT-IR) spectroscopy confirms complete removal of the solvents from the composite films. The surface morphology and phase separation in the composite films prepared using different solvents were characterized by scanning electron microscopy (SEM), as shown in FIG. 1. FIG. 2 show surface profilometer plots within the sampling length (5 mm) for the top surface of the composite films. Table 4 lists the solvent dependent piezoelectric performance, ($d_{33}$) and average surface roughness (Ra) of the piezoelectric polymer composites. The composite films prepared using DMSO (Example 5) and NMP (Example 6) have smoother surface and exhibit higher $d_{33}$ as compared to the films which were solution casted using MEK (Example 3) and THF (Example 4).

It is also seen in SEM micrographs (FIG. 1), that the barium titanate particles in composites form aggregates which are nearly spherical in shape. In Example 3 and 4, the filler aggregates are found (FIG. 1 (A) and (B)), while in Example 6, depressions are seen at the top surface (FIG. 1 (D). Spherical interconnected filler particles covered with thin polymer layer are seen in Example 5 (FIG. 1 (C)). It is believed that the evaporation of the solvent and settling of high density ceramic filler particles occur in parallel as the composite films are subjected to drying following the solution casting process. The solubility of the solvent in water can further influence the morphology. When the solvent has a low boiling point (<80° C.) and low dielectric constant (<20), it evaporates before the settling of the filler particles, thus most of the aggregates were found at the top surface. This has resulted in higher surface roughness and lower $d_{33}$. On the other hand, when the solvent has a high boiling point (≥80° C.) and high dielectric constant (≥20), the filler particles start settling down before the solvent completely evaporates. As the filler particles move away from the top surface, depressions are seen, resulting in smoother surface and higher $d_{33}$.

Figure 3:
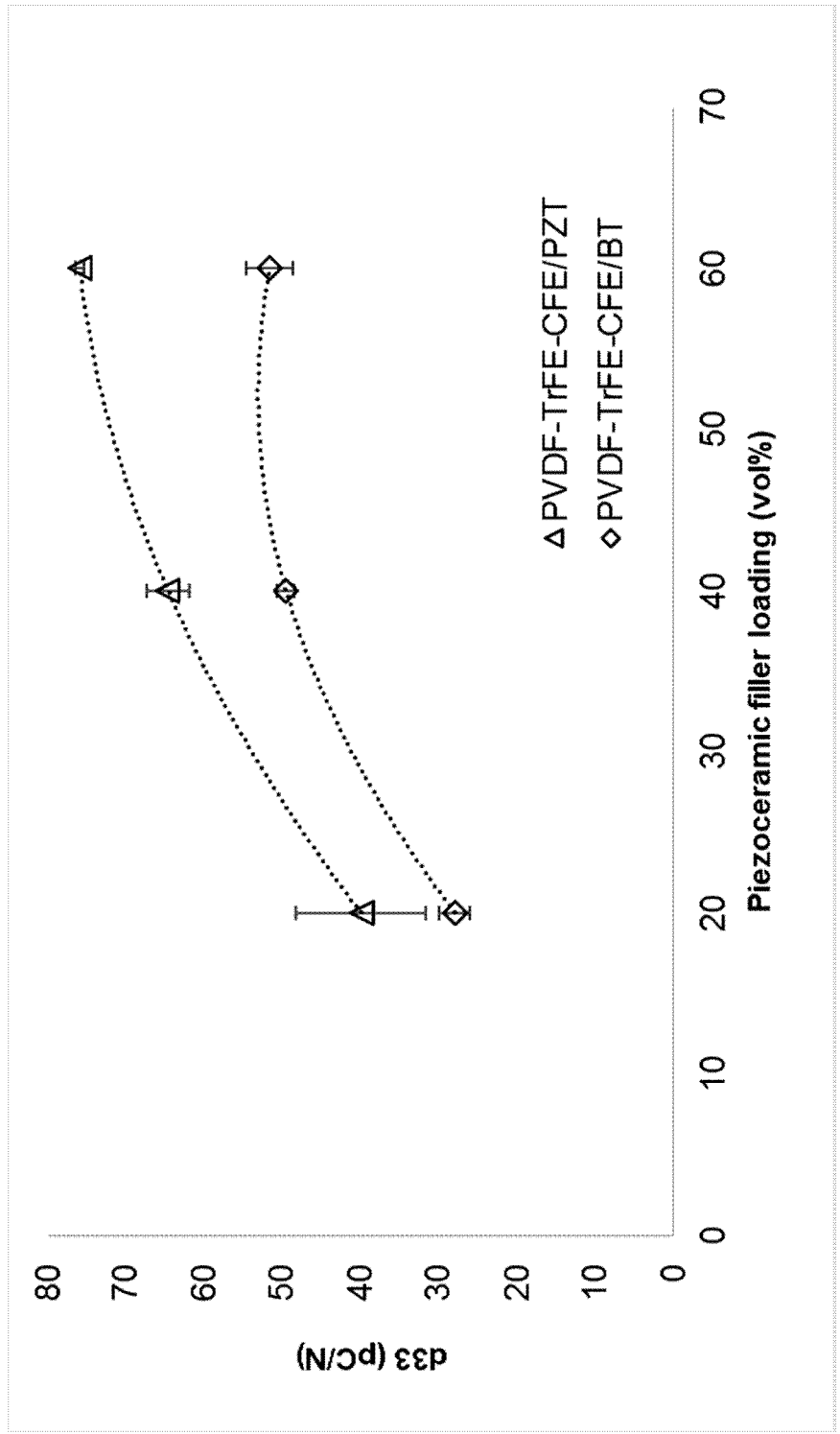
FIG. 3 shows the effect of piezo ceramic filler loading on piezoelectric strain constant of a comparative lead-based piezoelectric polymer composite and a lead-free piezoelectric polymer composite of the present invention. The bottom surface which was in contact with the substrate during drying was exposed to corona during poling.
Figure 4:
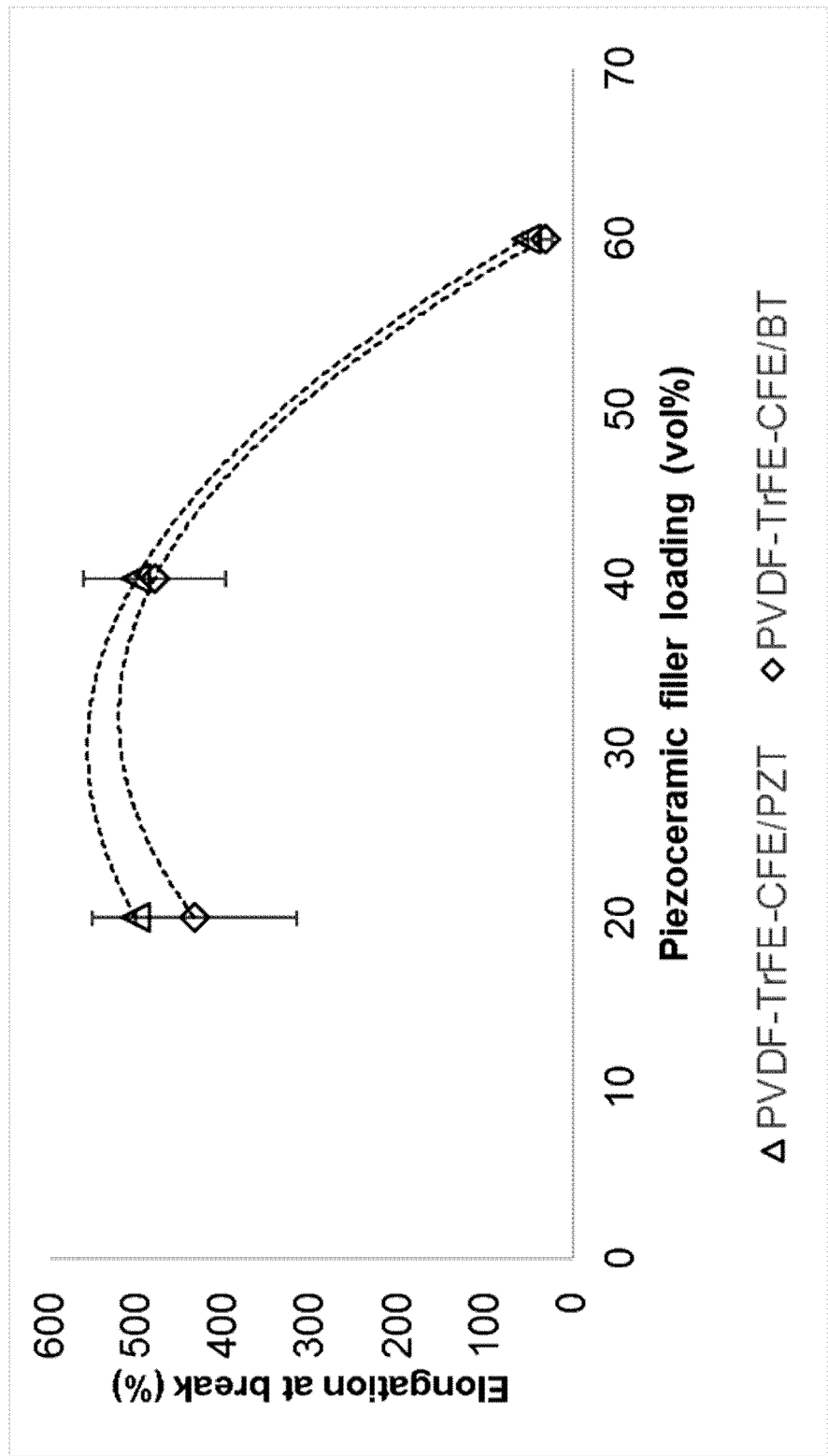
FIG. 4 shows the effect of piezo ceramic filler loading on elongation at break of a comparable lead-based piezoelectric polymer composite and a lead-free piezoelectric polymer composite of the present invention.
Figure 5:
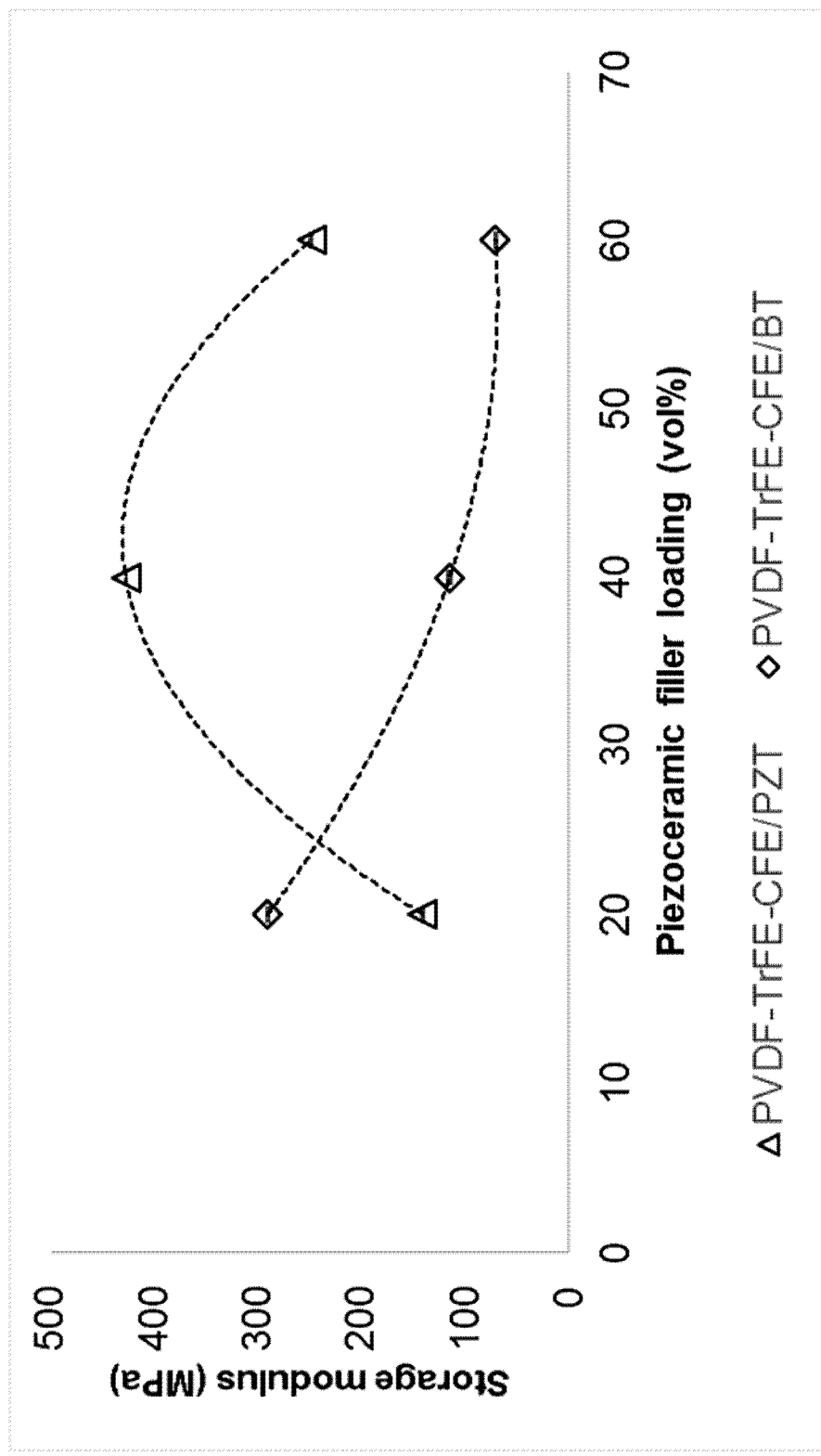
FIG. 5 shows the effect of piezo ceramic filler loading on storage modulus of comparative lead-based piezoelectric polymer composite and a lead-free piezoelectric polymer composite of the present invention.
Figure 6:
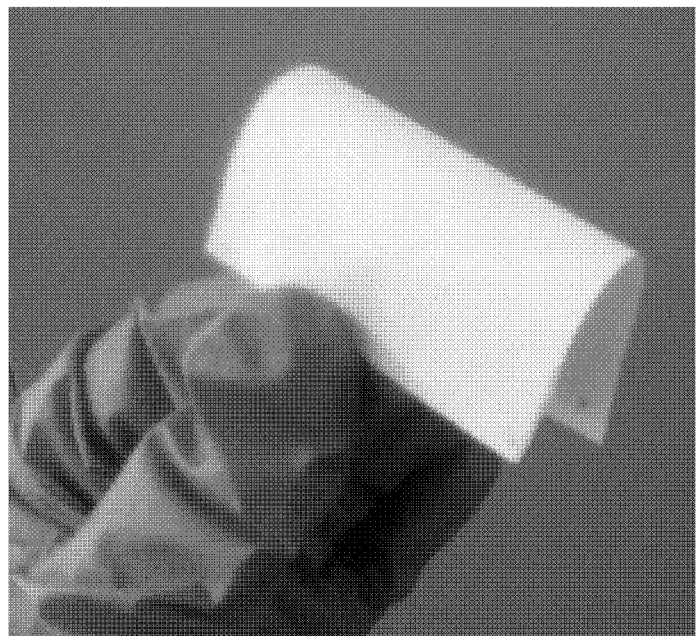
FIG. 6 is a photographic image of a corona poled lead-free piezocomposite film at 60 vol % BT loading (Example 3), in accordance with the aspects of present invention.

The particle size of the piezoceramic filler had a major influence on the piezoelectric strain constant in the lead-free piezoelectric composites, the measurement results summarized in Table 5. Barium titanate powders with average particle size of 300 nm resulted in a significant improvement of $d_{33}$. Table 6 A and B shows the effect of annealing time on piezoelectric strain constant for lead-free piezocomposites prepared using solvent having high boiling point, DMSO and NMP. The reduction of piezoelectric strain constant was less than 10% after annealing for 72 h at 110° C. FIG. 3 demonstrates the piezoelectric strain constant as a function of filler loading for lead-free and lead-based piezoelectric polymer composites. The bottom surface of the composite films which was in contact with the substrate during drying was exposed to corona poling. For both the piezocomposites, filler loading improves $d_{33}$ significantly up to 40% by volume, there after it has very little effect. FIGS. 4 and 5 illustrate the influence of filler loading on elongation at break and storage modulus respectively. From the results, it was determined that a significant reduction of elongation at break when the filler loading exceed 40% by volume in both the two types of piezocomposites. From the data for storage modulus of lead-free piezoelectric polymer composites, it was observed that a reduction in storage modulus occurred when filler loading was increased. In contrast, the storage modulus of lead-based piezoelectric polymer composites initially increased dramatically, and there after declined. The piezocomposite films retain the mechanical flexibility at high loading, a representative example is shown in FIG. 6.

Thus, the present invention provides criticality for a lead-free piezoelectric composite on particle size attribute and/or a solvent attribute based criteria that effectively can be translated to choose a specific particle size and/or solvent for the particular polymer-piezoelectric filler composite that provides the best combination of mechanical property and $d_{33}$ value.

TABLE 3

Physical properties of solvent

| Physical properties | THF | MEK | DMSO | NMP |
|---|---|---|---|---|
| Boiling point (° C.) | 65 | 80 | 189 | 202 |
| Solubility in water (g/100 g) | 30 | 25.6 | 25.3 | 10 |
| Dielectric constant | 7.6 | 18.5 | 47 | 32 |

TABLE 4

Different solvent effect on piezoelectric strain constant and surface roughness

| Example no. | $d_{33}$ (pC/N) | Ra (μm) |
|---|---|---|
| 3 | 39.4 ± 6.5 | 23.5 |
| 4 | 37 ± 3.2 | 16.8 |
| 5 | 47 ± 1.2 | 3.6 |
| 6 | 50.7 ± 1.8 | 4 |
| Comparative Ex3 | 58.1 ± 1.8 | |
| Comparative Ex4 | 55 ± 1.7 | |

TABLE 5

Particle size effect on piezoelectric strain constant

| Example no. | $d_{33}$ (pC/N) |
|---|---|
| 4 | 37 |
| 7 | 10.1 |
| 8 | 8.2 |

TABLE 6A

Effect of annealing time on piezoelectric strain constant, at annealing temp 110° C. (for bottom surface)

| Example no. | Annealing time (h) | $d_{33}$ (pC/N) |
|---|---|---|
| 4 | 5 | 37 |
| 4 | 24 | 18.9 |
| 5 | 5 | 46 |
| 5 | 24 | 46.5 |

TABLE 6B

Effect of annealing time on piezoelectric strain constant, at annealing temp 110° C. (for top surface)

| Example no. | Annealing time (h) | $d_{33}$ (pC/N) |
|---|---|---|
| 5 | 24 | 44.5 |
| 5 | 48 | 45.7 |
| 5 | 72 | 48.9 |
| 6 | 24 | 50.7 |
| 6 | 48 | 50.4 |

Although embodiments of the present application and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the above disclosure, processes, machines, manufacture, compositions of matter, means, methods, or steps, presently existing or later to be developed that perform substantially the same function or achieve substantially the same result as the corresponding embodiments described herein can be utilized. Accordingly, the appended claims are intended to include within their scope such processes, machines, manufacture, compositions of matter, means, methods, or steps.

The invention claimed is:

1. A method of producing a lead-free piezoelectric composite, the method comprising:
(a) adding lead-free piezoelectric particles having an average particle size of 200 nm to 1000 nm in a solution comprising a PVDF terpolymer and a solvent having a boiling point ≥80° C. at 0.1 MPa and a solubility in water of ≥0.1 g/g to form a dispersion or suspension;
(b) forming a polymeric matrix having the lead-free piezoelectric particles dispersed therein; and
(c) subjecting the polymeric matrix having the lead-free piezoelectric particles dispersed therein to an electric polarization treatment.

2. The method of claim 1, wherein the lead-free piezoelectric particles comprise barium titanate, particles of hydroxyapatite, particles of apatite, particles of lithium sulfate monohydrate, particles of sodium potassium niobate, particles of quartz, or combinations thereof.

3. The method of claim 2, wherein the lead-free piezoelectric particles are barium titanate particles.

4. The method of claim 1, wherein the solvent is methyl ethyl ketone (MEK), dimethylsulfoxide (DMSO), N-methyl-2-pyrrolidone (NMP), or combinations thereof.

5. The method of claim 1, wherein a volume percentage of piezoelectric particles in the composite is from 15 to 65 vol. %.

6. The method of claim 5, wherein the piezoelectric particles have a particle size of 250 to 350 nm.

7. The method of claim 1, wherein step (a) comprising solubilizing the polymeric material in the solvent at a temperature of 15 to 100° C. to produce a solution comprising 5 to 20 wt./vol % of polymer.

8. The method of claim 1, wherein forming the polymeric matrix comprises:
   (i) casting the dispersion on a substrate to form the polymeric matrix;
   (ii) drying the polymeric matrix at 25 to 45° C.; and
   (iii) annealing the dried polymeric matrix at a temperature of 80 to 150° C. for 1 to 50 hours.

9. The method of claim 1, wherein inducing an electric polarization comprises applying a poling field using corona discharge.

10. The method of claim 1, wherein the PVDF terpolymer is poly(vinylidene fluoride-trifluoroethylene-chlorofluoroethylene) (PVDF-TrFE-CFE).

11. A lead-free piezoelectric polymeric composite comprising a polyvinylidene fluoride (PVDF) based polymer matrix and lead-free piezoelectric particles having an average particle size of 200 to 1000 nm dispersed in the polymeric matrix, wherein the piezoelectric composite has a piezoelectric strain constant ($d_{33}$) of at least 40 pC/N and an elongation break of 30 to 500%.

12. The lead-free piezoelectric polymeric composite of claim 11, wherein the PVDF terpolymer is poly(vinylidene fluoride-trifluoroethylene-chlorofluoroethylene) (PVDF-TrFE-CFE) and the lead-free piezoelectric particles are barium titanate particles having an average particle size of 250 to 350 nm.

13. A piezoelectric device comprising the lead-free piezoelectric polymeric composite of claim 11, wherein the device is a piezoelectric sensor, a piezoelectric transducer, or a piezoelectric actuator, and wherein the device is mechanically flexible.

* * * * *